(12) United States Patent  (10) Patent No.: US 8,747,153 B2
Takano et al.  (45) Date of Patent: Jun. 10, 2014

(54) ELECTRICAL COAXIAL CONNECTOR (75) Inventors: Tomohito Takano, Tokyo (JP); Akio Funahashi, Tokyo (JP)

(73) Assignee: Dai-Ichi Seiko Co., Ltd., Kyoto (JP)

( * ) Notice: Subject to any disclaimer, the term of this patent is extended or adjusted under 35 U.S.C. 154(b) by 75 days.

(21) Appl. No.: 13/614,634

(22) Filed: Sep. 13, 2012

(65) Prior Publication Data
US 2013/0149897 A1   Jun. 13, 2013

(51) Int. Cl.
*H01R 9/05* (2006.01)

(52) U.S. Cl.
USPC .................................. 439/582; 439/63

(58) Field of Classification Search
CPC ................................ H01R 24/545; H01R 9/05
USPC .......................... 439/582, 581, 63
See application file for complete search history.

(56) References Cited

U.S. PATENT DOCUMENTS

| | | | |
|---|---|---|---|
| 6,607,400 B1 * | 8/2003 | Ko | 439/581 |
| 6,837,743 B2 * | 1/2005 | Ko | 439/582 |
| 7,351,067 B2 * | 4/2008 | Chen et al. | 439/63 |
| 7,367,840 B2 * | 5/2008 | Chen et al. | 439/581 |
| 7,445,458 B1 * | 11/2008 | Yamane | 439/63 |
| 7,704,096 B2 * | 4/2010 | Liao et al. | 439/582 |
| 8,512,073 B2 * | 8/2013 | Takano et al. | 439/578 |

FOREIGN PATENT DOCUMENTS

| | | |
|---|---|---|
| JP | H6-5158 U | 1/1994 |
| JP | 2002-324636 A | 11/2002 |

* cited by examiner

*Primary Examiner* — Xuong Chung Trans
(74) *Attorney, Agent, or Firm* — Studebaker & Brackett PC (57) ABSTRACT

An electrical coaxial connector comprising a signal contact member having a connecting terminal portion and a resilient engaging portion, a grounding contact member having an annular engaging portion for engaging with a mating connector fixed on a circuit board and a shell portion extending from the annular engaging portion, and a housing for supporting the signal contact member and the grounding contact member, wherein the resilient engaging portion is positioned at the inside of the annular engaging portion, the connecting terminal portion is put in electrical connection with a core conductor of a coaxial cable at the outside of the annular engaging portion, and the resilient engaging portion extends from the connecting terminal portion through the mating connector to engage with a signal terminal provided on the circuit board to which the mating connector is fixed.

4 Claims, 8 Drawing Sheets

ELECTRICAL COAXIAL CONNECTOR

BACKGROUND OF THE INVENTION

1. Field of the Invention

The present invention relates generally to an electrical coaxial connector, and more particularly to an improvement in an electrical coaxial connector which has a signal contact member and a grounding contact member insulated from each other to be connected respectively with a core conductor and an outer conductor insulated from each other of a coaxial cable which is provided with an internal insulator put between the core conductor and the outer conductor for surrounding the core conductor and an external insulator for surrounding the outer conductor, and is used to be coupled with a mating connector fixed, for example, to a circuit board.

2. Description of the Prior Art Including Information Disclosed Under 37 CFR 1.97 and 37 CFR 1.98

There has been often utilized a coaxial cable which has a core conductor, an outer conductor, an internal insulator put between the core conductor and the outer conductor for surrounding the core conductor and an external insulator for surrounding the outer conductor, for transmitting high-frequency signals between electrical parts, electric equipments or electronic apparatus. The high-frequency signal transmitted through the coaxial cable is put in a condition of electromagnetic shield so as to be inactive to leak out from the core conductor or to prevent noises from mixing thereinto from the outside. For example, the coaxial cable is connected with a circuit board on which high frequency signals are dealt with and the high frequency signal is transmitted through the coaxial cable from the circuit board to the outside or from the outside to the circuit board under the condition of electromagnetic shield.

For connecting the coaxial cable with the circuit board, an electrical coaxial connector is connected with an end of the coaxial cable to be coupled with a mating connector fixed to the circuit board. The electrical coaxial connector connected with the end of the coaxial cable (hereinafter, referred to as a coaxial cable connector) has a signal contact member with which the core conductor of the coaxial cable is connected and a grounding contact member with which the outer conductor of the coaxial cable is connected. The mating connector has a central contact to which the high-frequency signal dealt with on the circuit board is supplied and an annular grounding contact provided for surrounding the central contact to be supplied with a ground potential. When the coaxial cable connector is coupled with the mating connector on the circuit board, the grounding contact member of the coaxial cable connector engages with the annular grounding contact of the mating connector to be electrically connected with the same and the signal contact member of the coaxial cable connector comes into press-contact with the central contact of the mating connector to be electrically connected with the same.

For such a coupling of the coaxial cable connector with the mating connector as mentioned above, the mating connector is fixed to the circuit board with the central contact and the annular grounding contact surrounding the central contact each facing upward on a parts-mountable surface of the circuit board on which various electrical or electronic parts are mounted, so that the coaxial cable connector is moved downward toward the parts-mountable surface of the circuit board to be coupled with the mating connector in such a manner that the grounding contact member of the coaxial cable connector is engaged with the annular grounding contact of the mating connector and the signal contact member of the coaxial cable connector is put in press-contact with the central contact of the mating connector. Accordingly, the coaxial cable connector coupled with the mating connector which is fixed to the circuit board is postured to project from the parts-mountable surface of the circuit board with a predetermined measure of thickness in a direction perpendicular to the parts-mountable surface of the circuit board.

There has been previously proposed one of various types of electrical coaxial connectors, in which a signal contact member is not required for connection with a core conductor of a coaxial cable to be soldered with the core conductor of the coaxial cable so that the electrical coaxial connector is able to be connected easily and appropriately with the end of the coaxial cable, as disclosed in, for example, the Japanese patent application published before examination under publication number 2002-324636 (hereinafter, referred to as a published prior art document 1).

The previously proposed electrical coaxial connector disclosed in the published prior art document 1 comprises a shell (a grounding contact member) having an annular engaging portion and a shell-bending portion extending from the annular engaging portion, a connecting terminal member (a signal contact member) having a stationary contact portion and a movable contact portion and a pair of engaging portions each extending from the stationary contact portion, and an insulating member (a housing made of insulator) having a bending portion to be put between the connecting terminal member and the shell. The connecting terminal member is supported by the insulating member and the insulating member is supported by the shell. The stationary contact portion and the movable contact portion extending from the stationary contact portion of the connecting terminal member are so positioned in regard to the annular engaging portion of the shell that the engaging portions extending from the stationary contact portion are surrounded by the annular engaging portion of the shell.

When the electrical coaxial connector proposed previously as mentioned above is connected with the end portion of the coaxial cable so as to constitute a coaxial cable connector, the core conductor of the coaxial cable is positioned to correspond to the stationary contact portion of the connecting terminal member, and the movable contact portion of the connecting terminal member, the bending portion of the insulating member and the shell-bending portion of the shell are piled up on the core conductor of the coaxial cable, so that the core conductor of the coaxial cable is put between the stationary contact portion of the connecting terminal member and the movable contact portion of the connecting terminal member to be fixed to and connected with the connecting terminal member and the shell-bending portion of the shell is connected with the outer conductor of the coaxial cable. Then, the coaxial cable connector, that is, the previously proposed electrical coaxial connector disclosed in the published patent document 1 and connected with the end of the coaxial cable, is coupled with a mating connector fixed to a parts-mountable surface of a circuit board, which has a central contact and an annular grounding contact surrounding the central contact. In the coaxial cable connector coupled with the mating connector, the annular engaging portion of the shell is put in engagement with the annular grounding contact of the mating connector and the engaging portions extending from the stationary contact portion of the connecting terminal member is put in press-contact with the central contact of the mating coaxial connector.

When the previously proposed electrical coaxial connector disclosed in the published prior art document 1 is connected with the end of the coaxial cable so as to constitute the coaxial cable connector and coupled with the mating connector fixed to the circuit board, the core conductor of the coaxial cable connected with the connecting terminal member which has the engaging portions extending from the stationary contact portion and positioned to be surrounded by the annular engaging portion of the shell, is put between the stationary contact portion of the connecting terminal member and the movable contact portion of the connecting terminal member. On that occasion, the stationary and movable contacts of the connecting terminal member and the core conductor of the coaxial cable put between the stationary and movable contacts of the connecting terminal member so as to be fixed to and connected with the connecting terminal member are positioned to be piled up on the central contact of the mating connector at the inside of the annular engaging portion of the shell. Thereby, the electrical coaxial connector previously proposed for constituting the coaxial cable connector, as disclosed in the published prior art document 1, is to be designed to have a measure of thickness thereof increased in a direction which is perpendicular to the parts-mountable surface of the circuit board under a condition wherein the electrical coaxial connector is coupled with the mating connector fixed to the parts-mountable surface of the circuit board.

Accordingly, there has been also proposed a thin coaxial connecting device wherein a measure of thickness of an electrical coaxial connector which is provided to be connected with an end of a coaxial cable so as to constitute a coaxial cable connector and coupled with a mating connector fixed to a parts-mountable surface of a circuit board, can be reduced in a direction which is perpendicular to the parts-mountable surface of the circuit board under a condition wherein the electrical coaxial connector is coupled with the mating connector fixed to the parts-mountable surface of the circuit board, as disclosed in, for example, the Japanese utility model application published under publication number HEI6-5158 (hereinafter, referred to as published prior art document 2).

The previously proposed thin coaxial connector device disclosed in the published prior art document 2 includes a female connector (the electrical coaxial connector) provided to be connected to the end of the coaxial cable so as to constitute a coaxial cable connector and a male connector (the mating connector) provided to be fixed to a printed circuit board (the circuit board). The female connector has a conductive shell (a grounding contact member) provided to be connected with an outer conductor of the coaxial cable and a female contact (a signal contact member) provided to be connected with a core conductor of the coaxial cable and to project from the conductive shell to the outside thereof. The male connector has a tubular metallic shell (an annular grounding contact) provided to be put on the printed circuit board for engaging with the conductive shell of the female connector without any central contact.

When the conductive shell of the female connector connected to the end of the coaxial cable is put in engagement with the tubular metallic shell of the male connector fixed to the printed circuit board, the female contact of the female connector projecting from the female connector to the outside thereof comes into press-contact directly with a circuit pattern for signals (a signal terminal) provided on a parts-mountable surface of the printed circuit board to be electrically connected therewith. With such a female contact of the female connector connected to the core conductor of the coaxial cable as to come into press-contact directly with the circuit pattern for signals provided on the parts-mountable surface of the printed circuit board to be electrically connected therewith, any member provided between the female contact of the female connector and the circuit pattern for signals provided on the parts-mountable surface of the printed circuit board for connecting electrically the female contact with the circuit pattern for signals is not required and therefore a measure of thickness of the female connector on the parts-mountable surface of the printed circuit board, to which the male connector is fixed to be coupled with the female connector, can be reduced.

In the previously proposed female connector provided to be connected to the end of the coaxial cable so as to constitute the coaxial cable connector as disclosed in the published prior art document 2, it is advantageous that the female contact constituting the signal contact member is not required for connection with the core conductor of the coaxial cable to be soldered with the core conductor of the coaxial cable and a measure of thickness of the female connector on the parts-mountable surface of the printed circuit board, to which the male connector is fixed to be coupled with the female connector, can be reduced in the direction perpendicular to the parts-mountable surface of the circuit board. On the other hand, in the previously proposed female connector disclosed in the published prior art document 2, it is feared that such a situation that the female contact provided to be connected with the core conductor of the coaxial cable and to project from the conductive shell of the female connector to the outside thereof cannot be electrically connected appropriately with the circuit pattern for signals provided on the parts-mountable surface of the printed circuit board is brought about depending on the projecting length of the female contact from the conductive shell in the female connector.

That is, when the conductive shell of the female connector is put in engagement with the tubular metallic shell of the male connector fixed to the parts-mountable surface of the printed circuit board, the female contact of the female connector is moved toward the parts-mountable surface of the printed circuit board for coming into press-contact with the circuit pattern for signals provided on the parts-mountable surface of the printed circuit board in a direction through which the conductive shell of the female connector engages with the tubular metallic shell of the male connector.

Accordingly, it is probable that the female contact of the female connector, which projects from the conductive shell of the female connector to the outside thereof, does not reach enough to the circuit pattern for signals provided on the parts-mountable surface of the printed circuit board so as not to come into press-contact with the circuit pattern for signals, or the female contact of the female connector comes into press-contact with the circuit pattern for signals provided on the parts-mountable surface of the printed circuit board with excessive pressure to the circuit pattern for signals so that the circuit pattern for signals or the parts-mountable surface of the printed circuit board is subjected to undesirable strains or deformations when the conductive shell of the female connector is put in engagement with the tubular metallic shell of the male connector. In such a situation, the female contact of the female connector cannot be electrically connected appropriately with the circuit pattern for signals provided on the parts-mountable surface of the printed circuit board.

BRIEF SUMMARY OF THE INVENTION

Accordingly, it is an object of the present invention to provide an electrical coaxial connector which comprises a signal contact member with which a core conductor of a coaxial cable is to be connected, a grounding contact member with which an outer conductor of the coaxial cable is to be connected, and a housing made of insulator for supporting the signal contact member and the grounding contact member in such a manner that the signal contact member and the grounding contact member are insulated from each other, and which avoids the aforementioned problems and disadvantages encountered with the prior art.

Another object of the present invention is to provide an electrical coaxial connector which comprises a signal contact member with which a core conductor of a coaxial cable is to be connected, a grounding contact member with which an outer conductor of the coaxial cable is to be connected, and a housing made of insulator for supporting the signal contact member and the grounding contact member in such a manner that the signal contact member and the grounding contact member are insulated from each other, and in which the signal contact member is not required for electrical connection with the core conductor of the coaxial cable to be soldered with the core conductor of the coaxial cable so that the core conductor of the coaxial cable can be easily, surely and reliably connected with the signal contact member.

A further object of the present invention is to provide an electrical coaxial connector which comprises a signal contact member with which a core conductor of a coaxial cable is to be connected, a grounding contact member with which an outer conductor of the coaxial cable is to be connected, and a housing made of insulator for supporting the signal contact member and the grounding contact member in such a manner that the signal contact member and the grounding contact member are insulated from each other, and with which a measure of thickness of the electrical coaxial connector on the circuit board to which a mating connector is fixed to be coupled with the electrical coaxial connector can be reduced in a direction perpendicular to a parts-mountable surface of the circuit board, and the signal contact member comes into press-contact directly with a signal terminal provided on the circuit board to which the mating connector is fixed so as to be able to avoid a situation wherein the signal contact member cannot be electrically connected appropriately with the signal terminal provided on the circuit board.

According to the present invention, as claimed in any one of accompanying claims, there is provided an electrical coaxial connector which comprises a signal contact member having a connecting terminal portion provided with a pair of holding pieces between which a core conductor of a coaxial cable is tightly held to be electrically connected with the connecting terminal portion and a resilient engaging portion extending from the connecting terminal portion, a grounding contact member having an annular engaging portion for engaging with an annular grounding contact of a mating connector fixed to a circuit board and a shell portion extending to be bendable from the annular engaging portion to be connected with an outer conductor of a coaxial cable, and a housing made of insulator for supporting the signal contact member and the grounding contact member in such a manner that the signal contact member and the grounding contact member are insulated from each other, wherein the resilient engaging portion of the signal contact member is positioned at the inside of the annular engaging portion of the grounding contact member, the connecting terminal portion of the signal contact member is put in electrical connection with the core conductor of the coaxial cable at the outside of the annular engaging portion of the grounding contact member, and the resilient engaging portion of the signal contact member extends from the connecting terminal portion of the signal contact member through the inside of the annular grounding contact of the mating connector to engage with a signal terminal provided on an inside wall of a hole formed on the circuit board to which the mating connector is fixed in such a manner as to press the signal terminal in a first direction perpendicular to a second direction along which the annular engaging portion of the grounding contact member engages with the annular grounding contact of the mating connector when the annular engaging portion of the grounding contact member is put in engagement with the annular grounding contact of the mating connector.

In the electrical coaxial connector thus constituted in accordance with the present invention, the signal contact member and the grounding contact member are supported by the housing made of insulator so as to be insulated from each other. Then, the core conductor of the coaxial cable is tightly held between the holding pieces provided on the connecting terminal portion of the signal contact member to be electrically connected with the signal contact member and the outer conductor of the coaxial cable is connected with the shell portion of the grounding contact member so that the electrical coaxial connector is connected with an end of the coaxial cable to constitute a coaxial cable connector under a situation wherein the connecting terminal portion of the signal contact member is positioned at the outside of the annular engaging portion of the grounding contact member and the resilient engaging portion extending from the connecting terminal portion of the signal contact member is positioned at the inside of the annular engaging portion of the grounding contact member. The housing made of insulator has, for example, a hollow base surrounding the resilient engaging portion of the signal contact member at the inside of the annular engaging portion of the grounding contact member and a top end of the resilient engaging portion of the signal contact member projects from the hollow base of the housing to the outside thereof. The resilient engaging portion of the signal contact member comprises, for example, a pair of resilient tongue-shaped pieces facing each other.

The electrical coaxial connector according to the present invention thus connected with the end of the coaxial cable to constitute the coaxial cable connector, is coupled with the mating connector fixed to the circuit board with the annular engaging portion of the grounding contact member put in engagement with the annular grounding contact of the mating connector. In the electrical coaxial connector, the resilient engaging portion of the signal contact member extends from the connecting terminal portion of the signal contact member, with which the core conductor of the coaxial cable is connected, through the inside of the annular grounding contact of the mating connector toward the circuit board to which the mating connector is fixed, so that the top end of the resilient engaging portion of the signal contact member projects from the hollow base of the housing which surrounds the resilient engaging portion of the signal contact member at the inside of the annular engaging portion of the grounding contact member to the outside of the hollow base of the housing. Then, the top end of the resilient engaging portion of the signal contact member is operative to engage with the signal terminal provided on the inside wall of the hole formed on the circuit board to which the mating connector is fixed in such a manner as to press the signal terminal in the first direction perpendicular to the second direction along which the annular engaging portion of the grounding contact member engages with the annular grounding contact of the mating connector. On that occasion, for example, the resilient tongue-shaped pieces provided to face each other for constituting the resilient engaging portion of the signal contact member are shifted in position to approach to each other so that end portions of the resilient tongue-shaped pieces constituting the top end of the resilient engaging portion are inserted into the hole formed on the circuit board so as to come into press-contact with the signal terminal provided on the inside wall of the hole to be electrically connected with the same.

With the electrical coaxial connector according to the present invention, since the core conductor of the coaxial cable is tightly held between the holding pieces provided on the connecting terminal portion of the signal contact member to be electrically connected with the signal contact member, the signal contact member is not required for electrical connection with the core conductor of the coaxial cable to be soldered with the core conductor of the coaxial cable so that the core conductor of the coaxial cable can be easily, surely and reliably connected with the signal contact member.

Further, since the resilient engaging portion of the signal contact member extending from the connecting terminal portion of signal contact member engages directly with the signal terminal provided on the inside wall of the hole formed on the circuit board to which the mating connector is fixed so as to cause the core conductor of the coaxial cable to be electrically connected through the signal contact member with the signal terminal provided on the circuit board, any member provided between the resilient engaging portion of the signal contact member and the signal terminal provided on the circuit board for connecting electrically the resilient engaging portion of the signal contact member with the signal terminal provided on the circuit board is not required and therefore a measure of thickness of the electrical coaxial connector on the circuit board to which the mating connector is fixed can be reduced in a direction perpendicular to a parts-mountable surface of the circuit board.

Besides, the resilient engaging portion of the signal contact member is operative to press the signal terminal provided on the inside wall of the hole formed on the circuit board to which the mating connector is fixed in the first direction perpendicular to the second direction along which the annular engaging portion of the grounding contact member engages with the annular grounding contact of the mating connector when the annular engaging portion of the grounding contact member is put in engagement with the annular grounding contact of the mating connector, so that a direction along which the resilient engaging portion of the signal contact member comes into press-contact with the signal terminal provided on the circuit board is perpendicular to the direction along which the annular engaging portion of the grounding contact member engages with the annular grounding contact of the mating connector. As a result, so far as the length of the top end of the resilient engaging portion of the signal contact member projecting from the hollow base of the housing to the outside thereof is equal to or less than the thickness of the circuit board, the resilient engaging portion of the signal contact member can be electrically connected appropriately with the signal terminal provided on the circuit board so as to avoid a situation wherein the signal contact member cannot be electrically connected appropriately with the signal terminal provided on the circuit board.

The above, and other objects, features and advantages of the present invention will become apparent from the following detailed description taken in conjunction with the accompanying drawings.

DETAILED DESCRIPTION OF THE INVENTION

Figure 1:
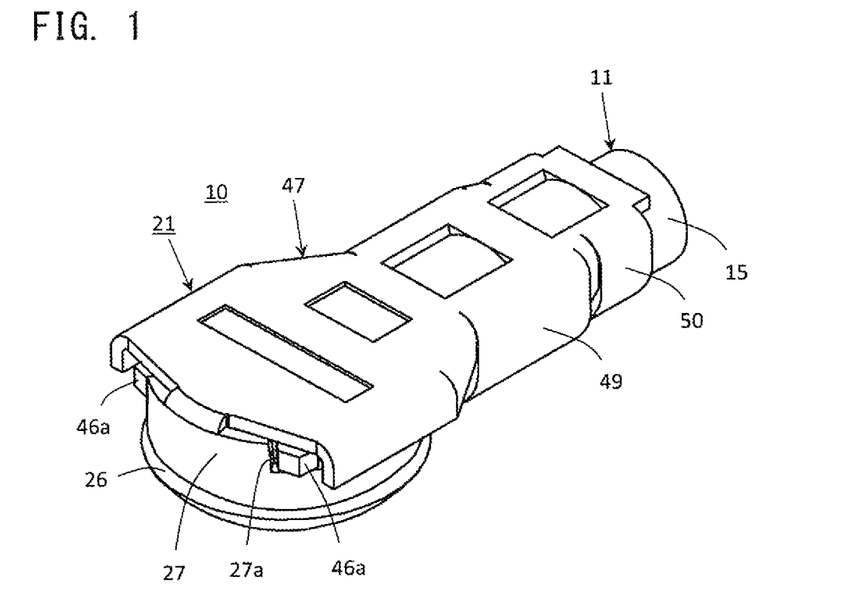
FIG. 1 is a schematic top side perspective view showing an embodiment of electrical coaxial connector according to the present invention, together with a part of a coaxial cable.
Figure 2:
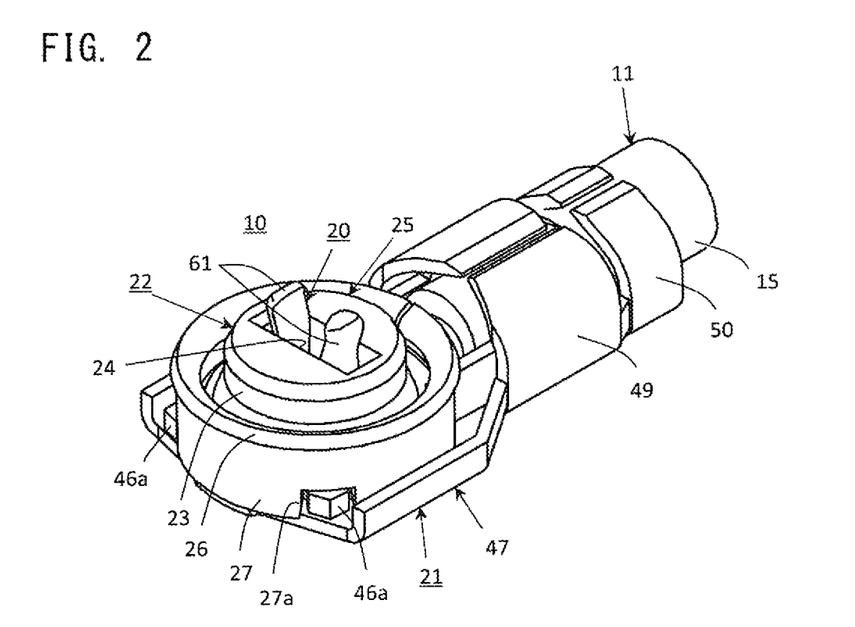
FIG. 2 is a schematic bottom side perspective view showing the embodiment of electrical coaxial connector according to the present invention, together with the part of the coaxial cable.

Each of FIGS. 1 and 2 shows an embodiment of electrical coaxial connector according to the present invention, together with an end of a coaxial cable with which the embodiment is connected to constitute a coaxial cable connector.

Figure 9:
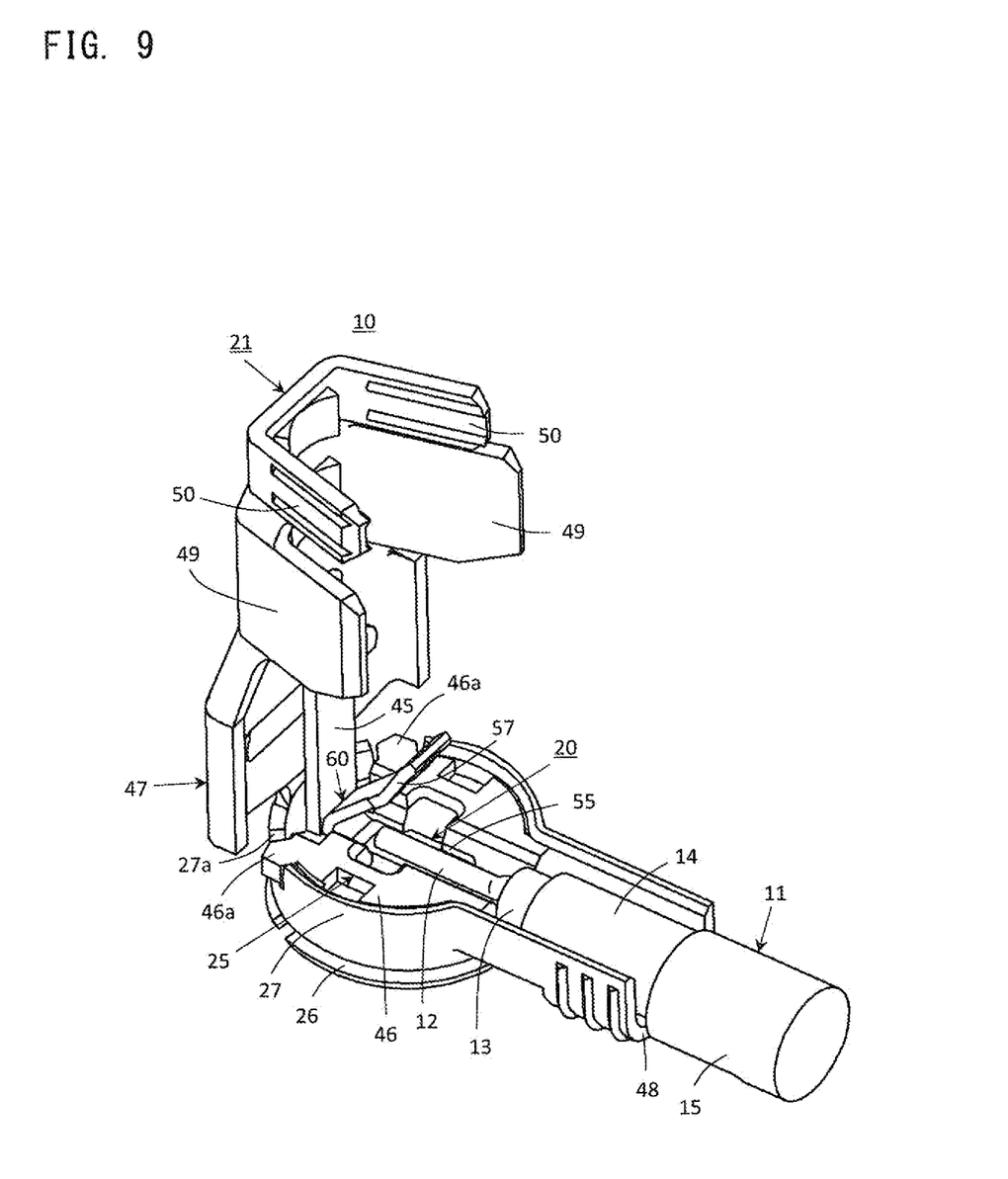
FIG. 9 is a schematic top side perspective view showing the embodiment of electrical coaxial connector according to the present invention on the way to connection with an end of the coaxial cable.

Referring to FIGS. 1 and 2, an electrical coaxial connector 10, which constitutes the embodiment of electrical coaxial connector according to the present invention, is connected with an end of a coaxial cable 11 which has a core conductor 12 shown in FIG. 9 mentioned later, an inner insulator 13 shown in FIG. 9 mentioned later and surrounding closely the core conductor 12, an outer conductor 14 shown in FIG. 9 mentioned later and surrounding closely the inner insulator 13, and an outer insulator 15 surrounding closely the outer conductor 14. As shown in FIG. 9, at the end of the coaxial cable 11, a part of the outer insulator 15 is cut off so that the outer conductor 14 is exposed and a part of each of the outer conductor 14 and the inner insulator 13 is further cut off so that the core conductor 12 is exposed.

The electrical coaxial connector 10 comprises a signal contact member 20 made of conductive material to be put in contact with the core conductor 12 of the coaxial cable 11, a grounding contact member 21 made of conductive material to be pit in contact with the outer conductor 14 of the coaxial cable 11, and a housing 22 made of insulator to support the signal contact member 20 and the grounding contact member 21 in such a manner that the signal contact member 20 and the grounding contact member 21 are insulated from each other.

The housing 22 has a hollow base 25 having an outer side surface 23 shaped into a combination of a circular cone and a short cylinder and a rectangular opening 24 formed at a central portion of the hollow base 25. The grounding contact member 21 has an annular engaging portion 26 surrounding the hollow base 25 of the housing 22. The hollow base 25 of the housing 22 and the annular engaging portion 26 of the grounding contact member 21 constitute a connectively engaging portion of the electrical coaxial connector 10.

The electrical coaxial connector 10 connected with the end of the coaxial cable 11 to constitute the coaxial cable connector is coupled with a mating connector 30 (shown in FIGS. 3 and 4 and explained later) with the connectively engaging portion constituted with the hollow base 25 of the housing 22 and the annular engaging portion 26 of the grounding contact member 21 for engaging with the mating connector 30.

Figure 3:
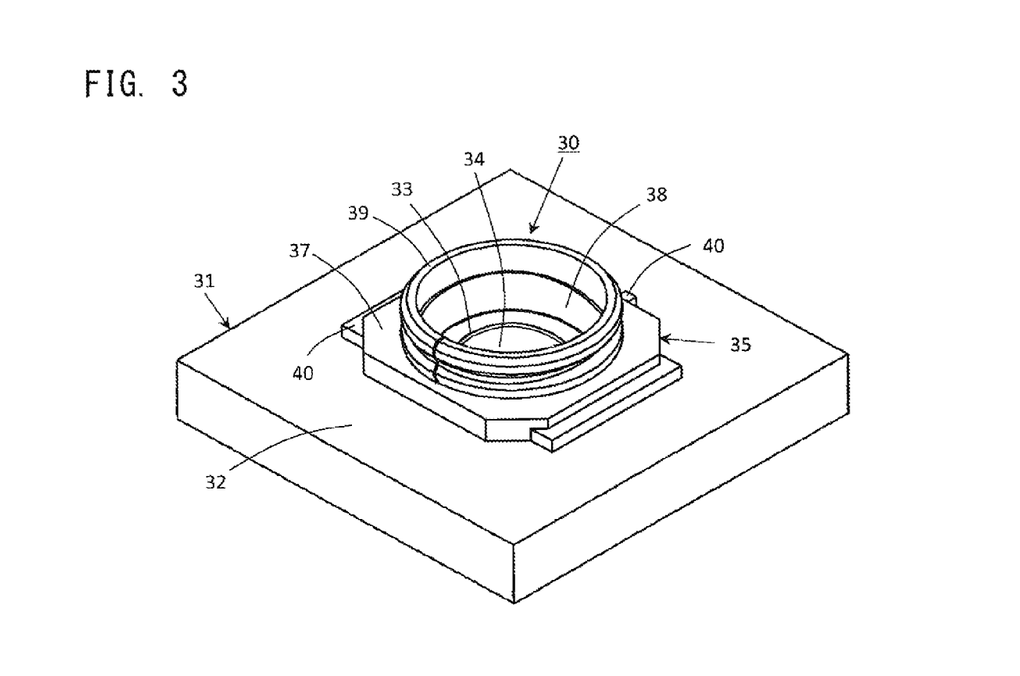
FIG. 3 is a schematic top side perspective view showing an example of a mating connector with which the embodiment of electrical coaxial connector according to the present invention is coupled, together with a part of a circuit board to which the example of the mating connector is fixed.

FIG. 3 shows the mating connector 30 with which the electrical coaxial connector 10 is coupled and a part of a circuit board 31 to which the mating connector 30 is fixed. The mating connector 30 is mounted on a parts-mountable surface 32 of the circuit board 31.

Figure 4:
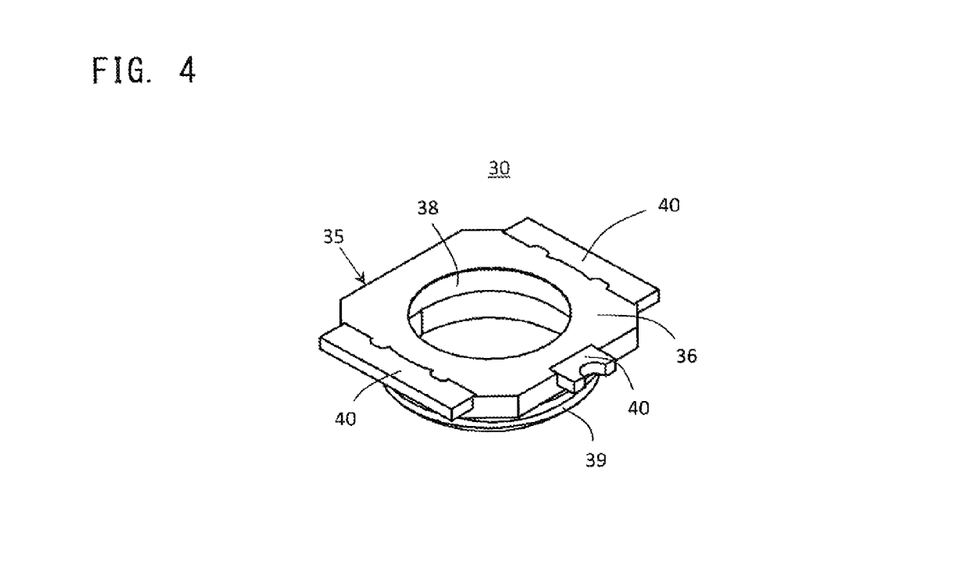
FIG. 4 is a schematic bottom side perspective view showing the example of the mating connector with which the embodiment of electrical coaxial connector according to the present invention is coupled.

The mating connector 30 is provided with a base board 35 made of insulator such as plastics to be put on the parts-mountable surface 32 of the circuit board 31, on which various electric or electronic parts are mounted, so as to cause the mating connector 30 to be fixed to the circuit board 31. As shown in FIG. 4, the base board 35 of the mating connector 30 has a bottom plane portion 36 facing closely the parts-mountable surface 32 of the circuit board 31 on which the base board 35 is put and a top plane portion 37 opposite to the bottom plane portion 36. At a central portion of the base board 35, an opening 38 is formed to pass through both of the bottom plane portion 36 and the top plane portion 37.

The mating connector 30 is also provide with an annular grounding contact 39 fixed to the base board 35. The annular grounding contact 39 of the mating connector 30 is made of conductive material to be shaped into an annular member put on the top plane portion 37 of the base board 35 for surrounding the opening 38 formed on the base board 35 and provided with a ground connecting portion 40 extending from the annular grounding contact 39 through the base board 35 to the outside of the base board 35 on the side of the bottom plane portion 36 of the base board 35. The annular grounding contact 39 is so provided that the annular engaging portion 26 of the grounding contact member 21 of the electrical coaxial connector 10 coupled with the mating connector 30 comes into engagement with the annular grounding contact 39 and the ground connecting portion 40 is, for example, soldered with a ground terminal provided on the parts-mountable surface 32 of the circuit board 31 on which the base board 35 is put so as to electrically connected with the same.

Incidentally, it is possible to fit up the annular grounding contact 39 to the base board 35 by means of insert molding, for example.

At a portion of the circuit board 31 corresponding to the inside of the opening 38 formed on the base board 35 of the mating connector 30 which is fixed to the circuit board 31, a hole 33 is formed to have a diameter smaller than that of the opening 38. The hole 33 is provided with a signal terminal 34 made of conductive material to be put on an inside wall of the hole 33. The signal terminal 34 is shaped into an annular conductor covering fully or partially the inside wall of the hole 33.

Figure 5:
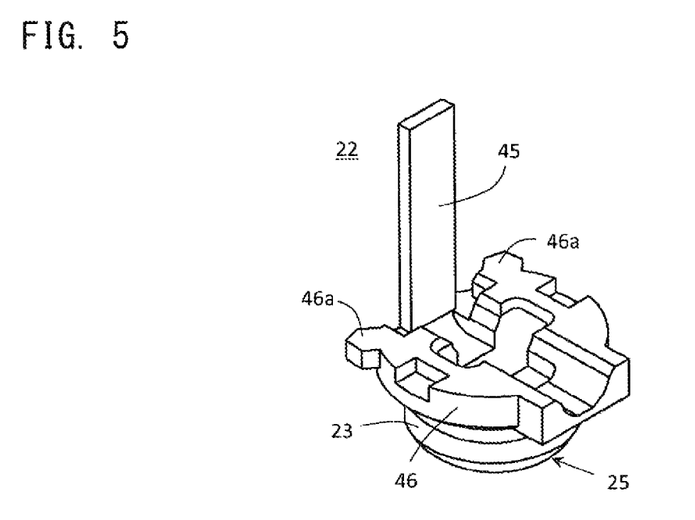
FIG. 5 is a schematic top side perspective view showing a housing made of insulator provided to be employed in the embodiment of electrical coaxial connector according to the present invention.
Figure 6:
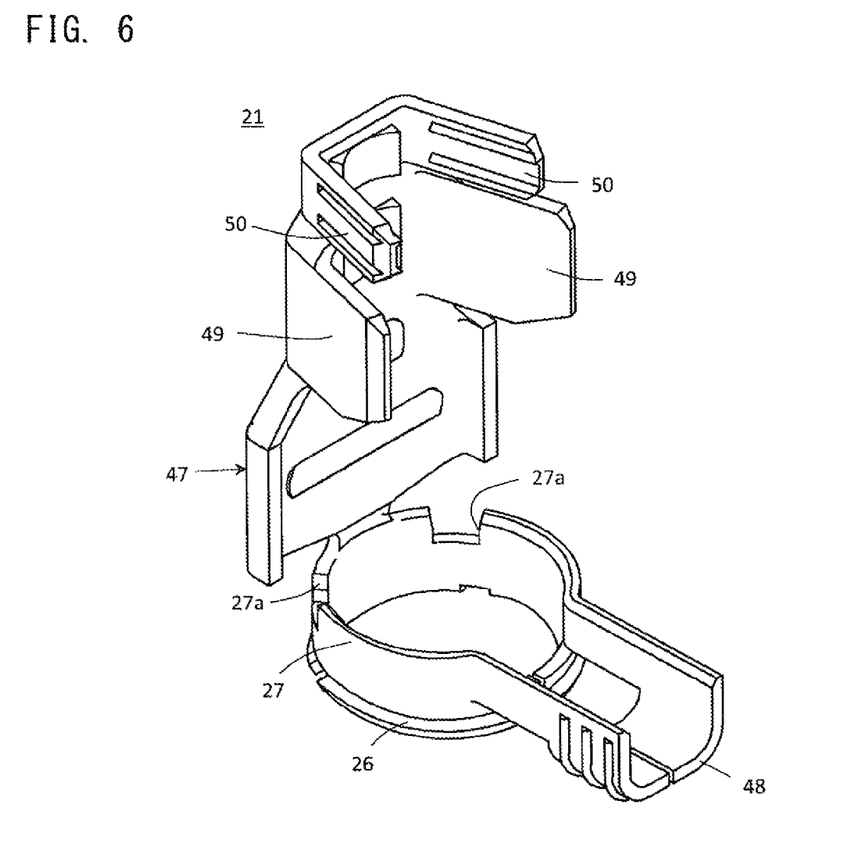
FIG. 6 is a schematic top side perspective view showing a grounding contact member provided to be employed in the embodiment of electrical coaxial connector according to the present invention.

As shown in FIG. 6, the housing 22 of the electrical coaxial connector 10 has, in addition to the hollow base 25, a bending press-contact portion 45 extending from an end of the hollow base 25 to be bendable and operative to be bent for coming into press-contact with the signal contact member 20, and a holding portion 46 which is formed with a part of the hollow base 25 to engage with a curved portion 27 extending from the annular engaging portion 26 of the grounding contact member 21 from the inside of the curved portion 27 for holding the grounding contact member 21. The bending press-contact portion 45 of the housing 22 is shaped in its entirety into a flat board-like portion, and the holding portion 46 of the housing 22 is provided with projections 46a, each of which is put in engagement with a recess 27a provided on the curved portion 27 of the grounding contact member 21

In the grounding contact member 21, as shown in FIG. 6, the recesses 27a with which the projections 46a provided on the holding portion 46 of the housing 22 are respectively engaged are provided on the curved portion 27 extending from the annular engaging portion 26. Then, the grounding contact member 21 has, in addition to the annular engaging portion 26 and the curved portion 27, a shell portion 47 extending from an end of the annular engaging portion 26 to be bendable and operative to be bent for pressing the bending press-contact portion 45 of the housing 22 to cause the same to be bent and further to be connected with the outer conductor 14 of the coaxial cable 11 having the core conductor 12 connected with the signal contact member 20, and a cable holding portion 48 extending from the curved portion 27 to come into contact with the outer conductor 14 of the coaxial cable 11 having the core conductor 12 connected with the signal contact member 20 for holding the coaxial cable 11. The bending press-contact portion 45 of the housing 22 extends along the shell portion 47 of the grounding contact member 21.

The shell portion 47 of the grounding contact member 21 is provided with a pair of first bendable holding portions 49 which are operative to be bent to approach each other for engaging with the cable holding portion 48 of the grounding contact member 21 and a pair of second bendable holding portions 50 which are operative to be bent to approach each other for engaging with the outer conductor 14 of the coaxial cable 11 having the core conductor 12 connected with the signal contact member 20.

Figure 7:
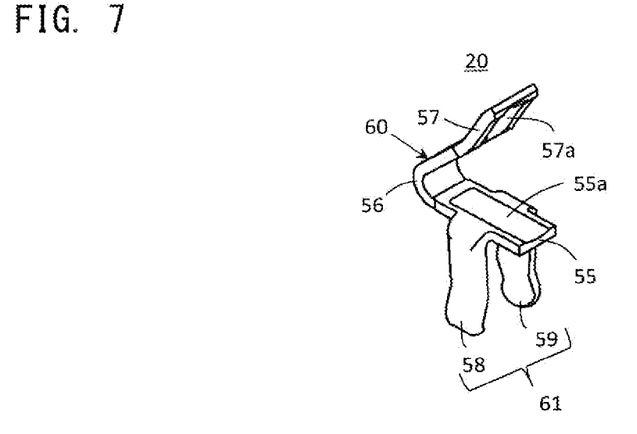
FIG. 7 is a schematic top side perspective view showing a signal contact member provided to be employed in the embodiment of electrical coaxial connector according to the present invention.

As shown in FIG. 7, the signal contact member 20 of the electrical coaxial connector 10 has a connecting terminal portion 60 which comprises a stationary part 55 shaped into a flat board-like part and fixed to the hollow base 25 of the housing 22 and a movable part 57 shaped into a flat board-like part and connected through a bending part 56 with the stationary part 55 to be shiftable in regard to the stationary part 55, and a resilient engaging portion 61 which comprises a pair of resilient tongue-shaped pieces 58 and 59 each extending from the stationary part 55 of the connecting terminal portion 60 to be opposite to each other. The connecting terminal portion 60 is provided for electrical connection with the core conductor 12 of the coaxial cable 11 and the resilient engaging portion 61 is provided for electrical connection with the signal terminal 34 provided on the circuit board 31 to which the mating connector 30 is fixed.

The movable part 57 of the connecting terminal portion 60 is operative to swing resiliently with a fulcrum positioned at the bending part 56 to approach to or go away from the stationary part 55 of the connecting terminal portion 60. The stationary part 55 is provided with a shallow groove 55a formed on an outer surface thereof and the movable part 57 is also provided with a shallow groove 57a formed on an inner surface thereof which faces the outer surface of the stationary part 55 when the movable part 57 is positioned to be close to the stationary part 55.

In the connecting terminal portion 60, when the movable part 57 is caused to be close to the stationary part 55 under a condition wherein the core conductor 12 of the coaxial cable 11 is put in the shallow groove 55a formed on the outer surface of the stationary part 55, the shallow groove 57a formed on the inner surface of the movable part 57 is opposite closely to the shallow groove 55a so that the core conductor 12 of the coaxial cable 11 is tightly held between the shallow groove 55a and the shallow groove 57a. The stationary part 55 provided with the shallow groove 55a and the movable part 57 provided with the shallow groove 57a constitute a pair of holding pieces of the connecting terminal portion 60 of the signal contact member 20, between which the core conductor 12 of the coaxial cable 11 is tightly held to be electrically connected with the signal contact member 20 so that the electrical coaxial connector 10 is connected with the end of the coaxial cable 11 to constitute the coaxial cable connector.

Each of the resilient tongue-shaped pieces 58 and 59 constituting the resilient engaging portion 61 and extending from the stationary part 55 of the connecting terminal portion 60 is operative to engage with the signal terminal 34 provided on the circuit board 31 to which the mating connector 30 is fixed so as to be electrically connected with the same.

The signal contact member 20 thus constituted with the connecting terminal portion 60 which comprises the stationary part 55, the bending part 56 and the movable part 57, and the resilient engaging portion 61 which comprises the resilient tongue-shaped pieces 58 and 59 each extending from the connecting terminal portion 60, is formed in a body, for example, by means of punching and bending a resilient metal thin plate.

When the signal contact member 20 having the connecting terminal portion 60 in which the core conductor 12 of the coaxial cable 11 is tightly held between the stationary part 55 and the movable part 57 to be electrically connected with the signal contact member 20 and the resilient engaging portion 61 which is constituted with the resilient tongue-shaped pieces 58 and 59, is held, together with the grounding contact member 21, by the housing 22, the stationary part 55 and the bending part 56 of the connecting terminal portion 60 are positioned in the holding portion 46 formed with the part of the hollow base 25 of the housing 22 in such a manner that the stationary part 55 is fixed to the hollow base 25 of the housing 22 and the resilient engaging portion 61 constituted with the resilient tongue-shaped pieces 58 and 59 extends from the stationary part 55 through the rectangular opening 24 formed at the central portion of the hollow base 25 of the housing 22 so that the top end of each of the resilient tongue-shaped pieces 58 and 59 opposite to each other is caused to project from the hollow base 25 of the housing 22 to the outside of the housing 22. Thereby, the resilient engaging portion 61 is positioned at the inside of the annular engaging portion 26 of the grounding contact member 21 and the connecting terminal portion 60 is put in electrical connection with the core conductor 12 of the coaxial cable 11 at the outside of the annular engaging portion 26 of the grounding contact member 21.

Figure 8:
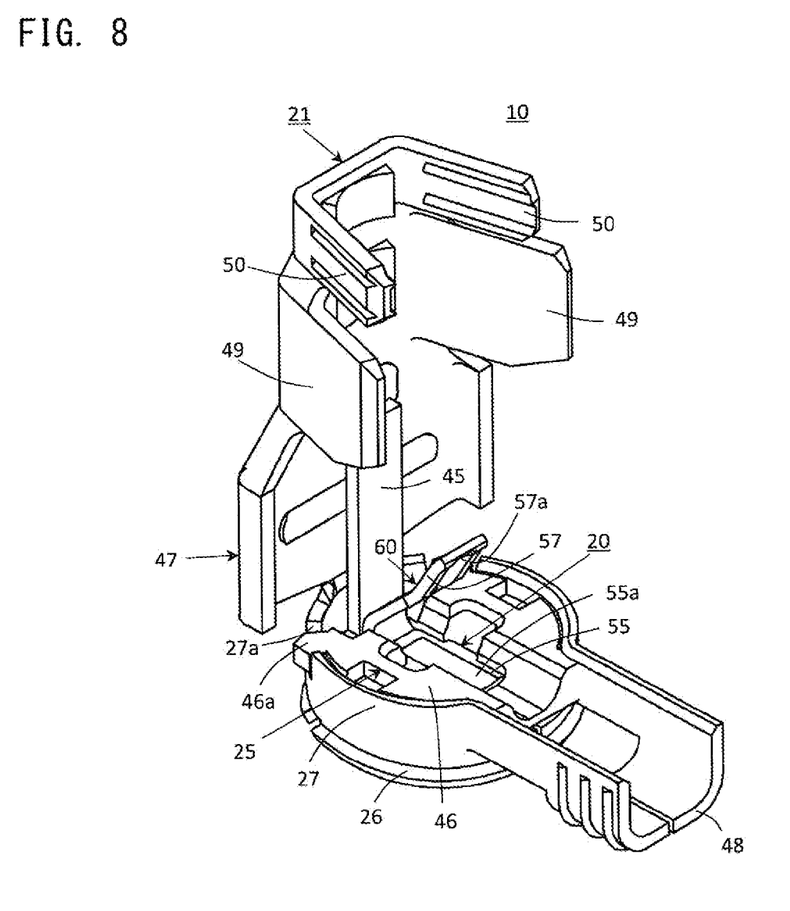
FIG. 8 is a schematic top side perspective view showing the embodiment of electrical coaxial connector according to the present invention.

The electrical coaxial connector 10 is assembled with the signal contact member 20 shown in FIG. 7, the grounding contact member 21 shown in FIG. 6, and the housing 22 shown in FIG. 5 provided for supporting both of the signal contact member 20 and the grounding contact member 21 so as to cause the signal contact member 20 and the grounding contact member 21 to be insulated from each other, as shown in FIG. 8.

Referring to FIG. 8, in an example of assembly of the electrical coaxial connector 10, first, the signal contact member 20 is fixed to the hollow base 25 of the housing 22 to be supported by the housing 22. In such a situation, the resilient engaging portion 61 extending from the connecting terminal portion 60 of the signal contact member 20 is inserted into the rectangular opening 24 formed at the central portion of the hollow base 25 of the housing 22 to pass through the rectangular opening 24 so that the top end of the resilient engaging portion 61 projects from the hollow base 25 to the outside of the housing 22 and the connecting terminal portion 60 of the signal contact member 20 is positioned at the outside of the hollow base 25 of the housing 22. Therefore, the hollow base 25 of the housing 22 is put in a condition for surrounding the resilient engaging portion 61 of the signal contact member 20.

The resilient tongue-shaped pieces 58 and 59 which constitute the resilient engaging portion 61 of the signal contact member 20 extending from the connecting terminal portion 60 of the signal contact member 20 through the rectangular opening 24 formed at the central portion of the hollow base 25, are put in such a condition as to be resiliently moved to approach to or go away from each other. For the resilient movement of each of the resilient tongue-shaped pieces 58 and 59, a predetermined space is formed between an inner wall of the hollow base 25 of the housing 22 forming the rectangular opening 24 and each of the resilient tongue-shaped pieces 58 and 59.

On that occasion, in the signal contact member 20, the top end of each of the resilient tongue-shaped pieces 58 and 59 opposite to each other, which constitutes the top end of the resilient engaging portion 61, is positioned to project from the hollow base 25 of the housing 22 to the outside of the housing 22, and the stationary part 55 and the bending part 56 of the connecting terminal portion 60 are positioned in the holding portion 46 formed with the part of the hollow base 25 of the housing 22.

Then, the grounding contact member 21 is fixed to the housing 22 to which the signal contact member 20 is fixed, so that the grounding contact member 21 is held by the housing 22. On that occasion, the holding portions 46 formed with the part of the hollow base 25 of the housing 22 engages with the annular engaging portion 26 of the grounding contact member 21 from the inside of the annular engaging portion 26 and the projections 46a provided on the holding portion 46 are put respectively in the recesses 27a provided on the curved portion 27 extending from the annular engaging portion 26 of the grounding contact member 21. The bending press-contact portion 45 extending from the end of the hollow base 25 of the housing 22 elongates along the shell portion 47 extending from the curved portion 27 of the grounding contact member 21.

In the electrical coaxial connector 10 thus assembled with the signal contact member 20 and the grounding contact member 21 supported by the housing 22, the resilient engaging portion 61 of the signal contact member 20 constituted with the resilient tongue-shaped pieces 58 and 59 is positioned at the inside of the annular engaging portion 26 of the grounding contact member 21, and the connecting terminal portion 60 of the signal contact member 20 constituted with the stationary part 55, the bending part 56 and the movable part 57 is positioned at the outside of the annular engaging portion 26 of the grounding contact member 21 for supporting the resilient engaging portion 61 extending from the stationary part 55 of the connecting terminal portion 60.

When the electrical coaxial connector 10 is connected with the end of the coaxial cable 11, the part of the outer insulator 15 is cut off so that the outer conductor 14 is exposed and each of the part of the outer conductor 14 and the part of the inner insulator 13 is further cut off so that the core conductor 12 is exposed at the end of the coaxial cable 11, and then the core conductor 12 exposed at the end of the coaxial cable 11 is put in the shallow groove 55a formed on the stationary part 55 of the connecting terminal portion 60 of the signal contact member 20, as shown in FIG. 9. On that occasion, the core conductor 12 of the coaxial cable 11 is positioned between the stationary part 55 and the movable part 57 of the connecting terminal portion 60.

After that, the shell portion 47 of the grounding contact member is bent in a direction toward the cable holding portion 48 of the grounding contact member 21, together with the bending press-contact portion 45 of the housing 22, to be postured almost in parallel with the cable holding portion 48 of the grounding contact member 21. The bending press-contact portion 45 of the housing 22 which is belt in accompany with the shell portion 47 of the grounding contact member 21 comes into press-contact with the movable part 57 of the connecting terminal portion 60 of the signal contact member 20 to cause the same to shift toward the stationary part 55 of the connecting terminal portion 60 of the signal contact member 20 so that the core conductor 12 of the coaxial cable 11 is tightly held between the shallow groove 55a formed on the stationary part 55 and the shallow groove 57a formed on the movable part 57 of the signal contact member 20. Thereby, the core conductor 12 of the coaxial cable 11 is tightly held by the holding pieces constituted with the stationary part 55 and the movable part 57 of the connecting terminal portion 60 of the signal contact member 20 so as to be electrically connected with the signal contact member 20. On that occasion, it is not necessary to solder the core conductor 12 of the coaxial cable 11 with the connecting terminal portion 60 of the signal contact member 20 for connecting the core conductor 12 of the coaxial cable 11 surely with the connecting terminal portion 60.

Finally, each pair of the first bendable holding portions 49 and the second bendable holding portions 50 provided on the shell portion 47 of the grounding contact member 21 are bent to approach each other so that the firs bendable holding portions 49 are put in engagement with the cable holding portion 48 of the grounding contact member 21 and the second bendable holding portions 50 are put in engagement with the outer insulator 15 of the coaxial cable 11. As a result, the electrical coaxial connector 10 connected with the end of the coaxial cable 11 for constituting the coaxial cable connector as shown in FIGS. 1 and 2 is obtained.

Figure 10:
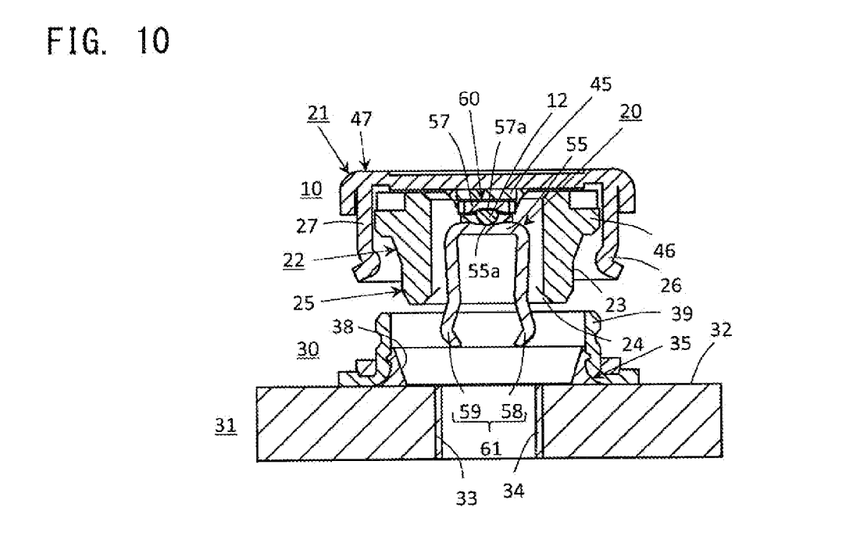
FIG. 10 is a schematic cross sectional view showing the embodiment of electrical coaxial connector according to the present invention connected with the end of the coaxial cable and the example of the mating connector fixed to the circuit board, with which the embodiment of electrical coaxial connector is going to be coupled.
Figure 11:
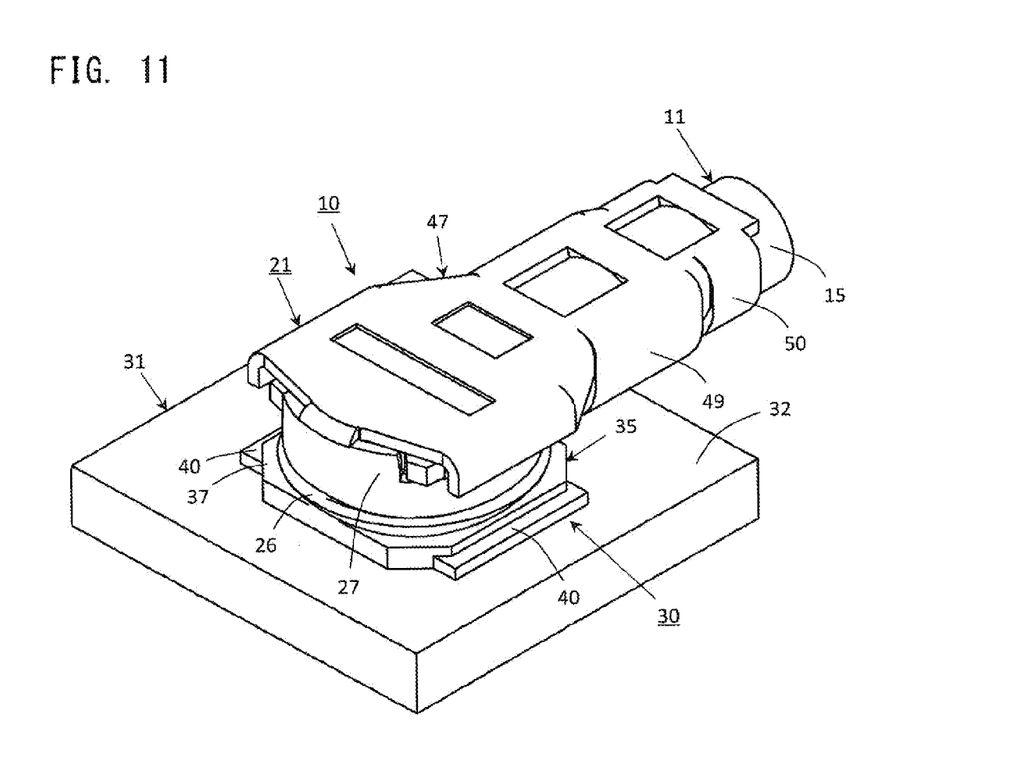
FIG. 11 is a schematic top side perspective view showing the embodiment of electrical coaxial connector according to the present invention connected with the end of the coaxial cable and a part of the example of the mating connector fixed to the circuit board, with which the embodiment of electrical coaxial connector has been coupled.

When the electrical coaxial connector 10 thus connected with the end of the coaxial cable 11 is coupled with the mating connector 30 fixed to the circuit board 31, the electrical coaxial connector 10 is so positioned as to cause the hollow base 25 of the housing 22 and the annular engaging portion 26 of the grounding contact member 21 surrounding the hollow base 25 to be opposite to the mating connector 30, as shown in FIG. 10. Then, the electrical coaxial connector 10 is moved toward the circuit board 31 to which the mating connector 30 is fixed so as to be coupled with the mating connector 30, as shown in FIGS. 11 and 12.

Figure 12:
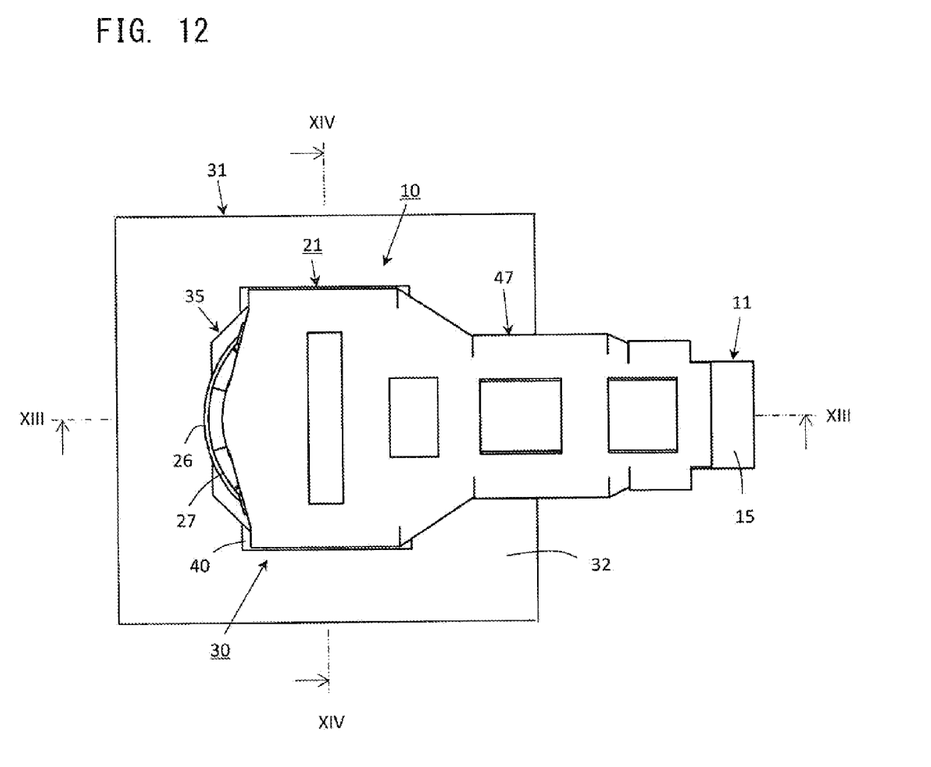
FIG. 12 is a schematic plan view showing the embodiment of electrical coaxial connector according to the present invention connected with the end of the coaxial cable and the part of the example of the mating connector fixed to the circuit board, with which the embodiment of electrical coaxial connector has been coupled.
Figure 13:
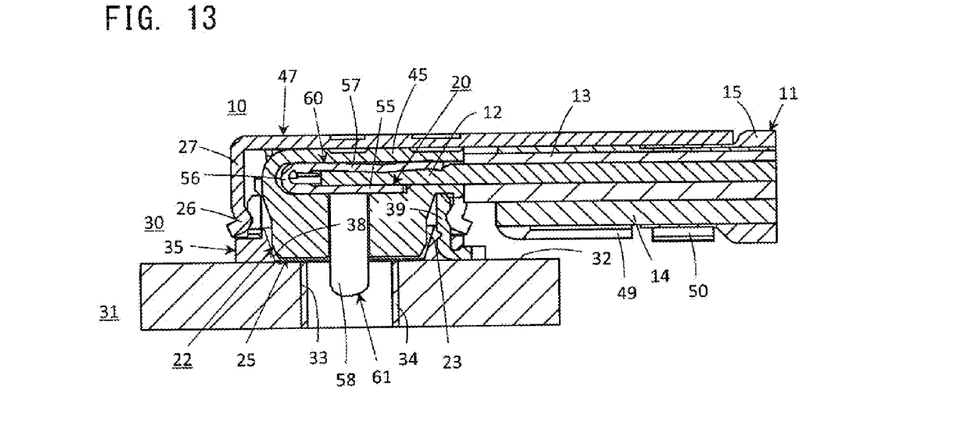
FIG. 13 is a schematic cross sectional view taken along line XIII-XIII in FIG. 12.
Figure 14:
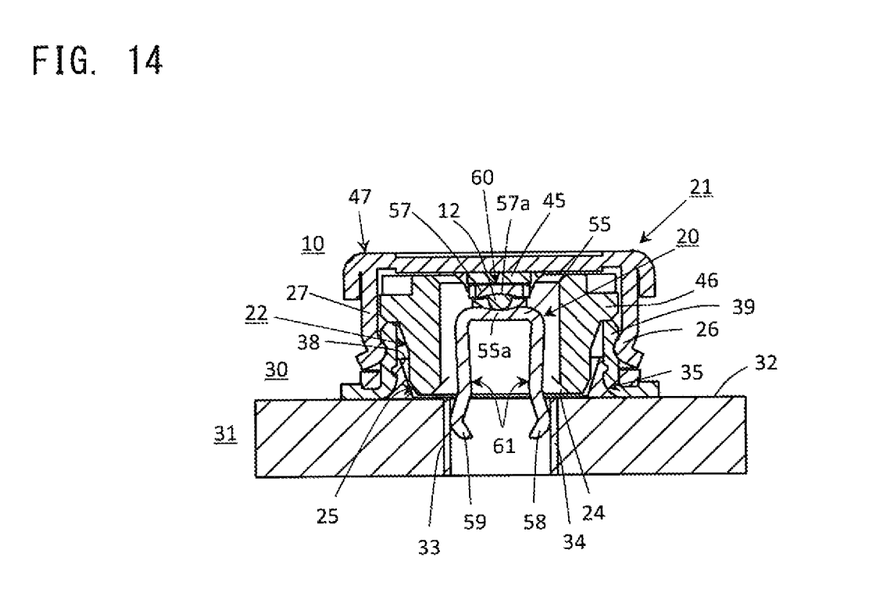
FIG. 14 is a schematic cross sectional view taken along line XIV-XIV in FIG. 12.

In the electrical coaxial connector 10 thus coupled with the mating connector 30, the annular engaging portion 26 of the grounding contact member 21 engages with the annular grounding contact 39 of the mating connector 30 to be electrically connected with the same, the hollow base 25 of the housing 22 is put in the opening 38 formed on the base board 35 surrounded by the annular grounding contact 39 of the mating connector 30, and a surface of the base board 35 on which the rectangular opening 24 opens face the parts-mountable surface 32 of the circuit board 31 to which the mating connector 30 is fixed, as shown in FIG. 13 which is the cross-sectional view taken along line XIII-XIII in FIG. 12 and FIG. 14 which is the cross-sectional view taken along line XIV-XIV in FIG. 12. Thereby, the resilient engaging portion 61 of the signal contact member 20 surrounded by the hollow base 25 of the housing 22 extends to pass through the inside of the annular grounding contact 39 of the mating connector 30

The top end of the resilient engaging portion 61 of the signal contact member 20 projecting through the rectangular opening 24 formed on the hollow base 25 of the housing 22 to the outside of the hollow base 25, which is constituted with the top end of each of the resilient tongue-shaped pieces 58 and 59 opposite to each other, engages with the signal terminal 34 provided on the inside wall of the hole 33 formed on the circuit board 31 to which the mating connector 30 is fixed so as to come directly into press-contact with the same. On that occasion, the resilient tongue-shaped pieces 58 and 59 constituting the resilient engaging portion 61 of the signal contact member 20 is moved to approach to each other, so that the top end of each of the resilient tongue-shaped pieces 58 and 59 is inserted into the hole 33 formed on the circuit board 31 to come into press-contact with the signal terminal 34 provided on the inside wall of the hole 33. Thereby, the top end of each of the resilient tongue-shaped pieces 58 and 59 constituting the resilient engaging portion 61 of the signal contact member 20 is operative to engage with the signal terminal 34 provided on the inside wall of the hole 33 formed on the circuit board 31 to which the mating connector 30 is fixed in such a manner as to press the signal terminal 34 in a first direction perpendicular to a second direction along which the annular engaging portion 26 of the grounding contact member 21 engages with the annular grounding contact 39 of the mating connector 30. Accordingly, the resilient engaging portion 61 of the signal contact member 20 of the electrical coaxial connector 10 extends from through the inside of the annular grounding contact 39 of the mating connector 30 to engage with the signal terminal 34 provided on the inside wall of the hole 33 formed on the circuit board 31 to which the mating connector 30 is fixed to be electrically with the same in such a manner as to press the signal terminal 34 in the first direction perpendicular to the second direction along which the annular engaging portion 26 of the grounding contact member 21 engages with the annular grounding contact 39 of the mating connector 30.

With the resilient engaging portion 61 of the signal contact member 20 of the electrical coaxial connector 10 thus coming directly into press-contact with the signal terminal 34 provided on the circuit board 31 to which the mating connector 30 is fixed to be electrically connected with the same, the core conductor 12 of the coaxial cable 11 tightly held by the connecting terminal portion 60 of the signal contact member 20 so as to be electrically connected with the signal contact member 20, is further electrically connected through the connecting terminal portion 60 of the signal contact member 20 with the signal terminal 34 provided on the circuit board 31 to which the mating connector 30 is fixed.

With the electrical coaxial connector 10 constituting the embodiment of electrical coaxial connector according to the present invention as described above, since the core conductor 12 of the coaxial cable 11 is tightly held between the holding pieces provided on the connecting terminal portion 60 of the signal contact member 20 to be electrically connected with the signal contact member 20, the signal contact member 20 is not required for electrical connection with the core conductor 12 of the coaxial cable 11 to be soldered with the core conductor 12 of the coaxial cable 11 so that the core conductor 12 of the coaxial cable 11 can be easily, surely and reliably connected with the signal contact member 20.

Further, since the resilient engaging portion 61 of the signal contact member 20 extending from the connecting terminal portion 60 of the signal contact member 20 engages directly with the signal terminal 34 provided on the inside wall of the hole 33 formed on the circuit board 31 to which the mating connector 30 is fixed so as to cause the core conductor 12 of the coaxial cable 11 to be electrically connected through the signal contact member 20 with the signal terminal 34 provided on the circuit board 31, any member provided between the resilient engaging portion 61 of the signal contact member 20 and the signal terminal 34 provided on the circuit board 31 for connecting electrically the resilient engaging portion 61 of the signal contact member 20 with the signal terminal 34 provided on the circuit board 31 is not required and therefore a measure of thickness of the electrical coaxial connector 10 on the circuit board 31 to which the mating connector 30 is fixed can be reduced in a direction perpendicular to the parts-mountable surface 32 of the circuit board 31.

Besides, the resilient engaging portion 61 of the signal contact member 20 is operative to press the signal terminal 34 provided on the inside wall of the hole 33 formed on the circuit board 31 to which the mating connector 30 is fixed in the first direction perpendicular to the second direction along which the annular engaging portion 26 of the grounding contact member 21 engages with the annular grounding contact 39 of the mating connector 30 when the annular engaging portion 26 of the grounding contact member 21 is put in engagement with the annular grounding contact 39 of the mating connector 30, so that a direction along which the resilient engaging portion 61 of the signal contact member 20 comes into press-contact with the signal terminal 34 provided on the circuit board 31 is perpendicular to the direction along which the annular engaging portion 26 of the grounding contact member 21 engages with the annular grounding contact 39 of the mating connector 30. As a result, so far as the length of the top end of the resilient engaging portion 61 of the signal contact member 20 projecting from the hollow base 25 of the housing 22 to the outside thereof is equal to or less than the thickness of the circuit board 31, the resilient engaging portion 61 of the signal contact member 20 can be electrically connected appropriately with the signal terminal 34 provided on the circuit board 31 so as to avoid a situation wherein the signal contact member 20 cannot be electrically connected appropriately with the signal terminal 34 provided on the circuit board 31.

The invention claimed is:

1. An electrical coaxial connector comprising;
a signal contact member having a connecting terminal portion provided with a pair of holding pieces between which a core conductor of a coaxial cable is tightly held to be electrically connected with the connecting terminal portion and a resilient engaging portion extending from the connecting terminal portion,
a grounding contact member having an annular engaging portion for engaging with an annular grounding contact of a mating connector fixed to a circuit board and a shell portion extending to be bendable from the annular engaging portion to be connected with an outer conductor of the coaxial cable, and
a housing made of insulator for supporting the signal contact member and the grounding contact member in such a manner that the signal contact member and the grounding contact member are insulated from each other,
wherein the resilient engaging portion of the signal contact member is positioned at the inside of the annular engaging portion of the grounding contact member, the connecting terminal portion of the signal contact member is put in electrical connection with the core conductor of the coaxial cable at the outside of the annular engaging portion of the grounding contact member, and the resilient engaging portion of the signal contact member extends from the connecting terminal portion of the signal contact member through the inside of the annular grounding contact of the mating connector to engage with a signal terminal provided on an inside wall of a hole formed on the circuit board to which the mating connector is fixed in such a manner as to press the signal terminal in a first direction perpendicular to a second direction along which the annular engaging portion of the grounding contact member engages with the annular grounding contact of the mating connector when the annular engaging portion of the grounding contact member is put in engagement with the annular grounding contact of the mating connector.

2. An electrical coaxial connector according to claim 1, wherein the resilient engaging portion of the signal contact member is constituted with a pair of resilient tongue-shaped pieces opposite to each other for coming into press-contact with the signal terminal provided on the circuit board to which the mating connector is fixed.

3. An electrical coaxial connector according to claim 2, wherein the resilient tongue-shaped pieces constituting the resilient engaging portion of the signal contact member is operative to be moved to approach to each other so that a top end of each of the resilient tongue-shaped pieces is inserted into the hole formed on the circuit board to come into press-contact with the signal terminal provided on the inside wall of the hole.

4. An electrical coaxial connector according to claim 1, wherein the housing has a hollow base for surrounding the resilient engaging portion of the signal contact member at the inside of the annular engaging portion of the grounding contact member and a top end of the resilient engaging portion of the signal contact member is operative to project from the an end of the hollow base of the housing to the outside of the hollow base.

* * * * *

UNITED STATES PATENT AND TRADEMARK OFFICE
CERTIFICATE OF CORRECTION

PATENT NO. : 8,747,153 B2  Page 1 of 1
APPLICATION NO. : 13/614634
DATED : June 10, 2014
INVENTOR(S) : Tomohito Takano and Akio Funahashi

It is certified that error appears in the above-identified patent and that said Letters Patent is hereby corrected as shown below:

Title Page: insert

--(30)     Foreign Application Priority Data

October 12, 2011    JP..........................................2011-224668--

Signed and Sealed this
Fourteenth Day of October, 2014

Michelle K. Lee
*Deputy Director of the United States Patent and Trademark Office*